United States Patent [19]
Park

[11] Patent Number: 5,924,009
[45] Date of Patent: Jul. 13, 1999

[54] TITANIUM SILICIDE INTERCONNECT METHOD

[75] Inventor: Bo-Hyun Park, Seongnam, Rep. of Korea

[73] Assignee: Hyundai Electronics Industries, Co., Ltd, Rep. of Korea

[21] Appl. No.: 08/762,030

[22] Filed: Dec. 11, 1996

[30] Foreign Application Priority Data

Dec. 29, 1995 [KR] Rep. of Korea .................. 95-66080

[51] Int. Cl.⁶ ............................................. H01L 21/4763
[52] U.S. Cl. ..................... 438/649; 438/651; 438/680; 438/682; 438/683
[58] Field of Search ................... 438/681, 683, 438/660, 680, 653, 649, 651, 682

[56] References Cited

U.S. PATENT DOCUMENTS 5,344,792 9/1994 Sandhu et al. ..................... 437/200
5,344,793 9/1994 Zeininger et al. ................... 437/200
5,393,565 2/1995 Suzuki et al. ...................... 427/255.2

OTHER PUBLICATIONS

Patent Abstracts of Japan, 5–090207, Apr. 9, 1993.
Patent Abstracts of Japan, 7–094446, Apr. 7, 1995.
Patent Abstracts of Japan, 7–235607, Sep. 5, 1995.
Patent Abstracts of Japan, 8–283944, Oct. 29, 1996.

*Primary Examiner*—Charles Bowers
*Assistant Examiner*—Reneé R. Berry
*Attorney, Agent, or Firm*—Ware, Fressola, Van Der Sluys & Adolphson LLP

[57] ABSTRACT

A technology of forming a semiconductor integrated device is disclosed. According to the technology, titanium silicide is formed from an interaction between a source of $TiCl_2$ transformed from $TiCl_4$, and a source of hydrogen containing gas. The silicide layer includes a relatively planar interface with the gate electrode, the relatively planar interface being substantially free from gouges formed by a redistribution of a portion of the silicon atoms in the gate electrode.

23 Claims, 3 Drawing Sheets

TITANIUM SILICIDE INTERCONNECT METHOD

BACKGROUND OF THE INVENTION

1. Field of the Invention

The present invention relates to the manufacture of semiconductor integrated circuit devices. More particularly, the invention provides a technique for fabrication of a titanium silicide film using $TiCl_2$ on a gate electrode. The invention can also be applied to fabrication of source/drain regions, polysilicon interconnects, and other structures.

2. Description of the Related Art

Various techniques have been proposed to reduce the resistivity of a gate electrode by forming a titanium silicide layer thereon. These techniques, however, often consume a great deal of silicon from the gate electrode to form the titanium silicide. In some cases, the gate electrode is severely damaged(e.g., large gouges, grooves, etc.). Further, the flow of source gases was extremely difficult to control.

Furthermore, these technique often rely upon high temperature, which can cause impurities to diffuse from the gate electrode into the titanium silicide layer and often cause lower device reliability and other problems. Accordingly, conventional techniques for forming titanium silicide on gate electrodes suffer from numerous limitations and are therefore undesirable in most cases.

From the above it is seen that a technique for forming a gate electrode layer that is easy to implement, reduces resistivity, and can be performed at lower temperature is desired.

SUMMARY OF THE INVENTION

The present invention provides an improved technique for forming a titanium metal layer overlying silicon in the manufacture of semiconductor devices. This technique, including a method, device, and apparatus, is easy to use and provides improved step coverage overlying varying topological features. In addition, the technique reduces the amount of silicon depletion from an underlying silicon layer.

According to one object of the present invention, a semiconductor substrate is provided in a reactor. A source of $TiCl_4$, and a source of hydrogen containing gas are provided in the reactor, the source of $TiCl_4$ and the source of hydrogen containing gas and the source of $TiCl_4$ are coupled to the reactor. $TiCl_2$ is formed from an interaction with at least the $TiCl_4$ and the hydrogen containing gas in a chamber, the chamber being coupled between the reactor and the source of hydrogen and the source of $TiCl_4$. A gaseous mixture comprising the $TiCl_2$ and a silicon containing gas are introduced into the reactor. A titanium silicide layer overlying the semiconductor substrate is formed by an interaction of at least the $TiCl_2$ and the silicon containing gas.

According to the other object, a semiconductor integrated device includes a semiconductor substrate, a gate dielectric layer overlying said semiconductor substrate, a gate electrode including silicon atoms overlying the gate dielectric layer, and a titanium silicide layer overlying the gate electrode, wherein the silicide layer includes a relatively planar interface with the gate electrode, the relatively planar interface being substantially free from gouges formed by a redistribution of a portion of the silicon atoms in the gate electrode.

BRIEF DESCRIPTION OF THE DRAWINGS

These and other features, aspects, and advantages of the present invention will become better understood with regard to the following description, appended claims, and accompanying drawings wherein:

DETAILED DESCRIPTION OF THE PRESENT INVENTION

Hereinbelow, the specific embodiment will be described referring to the enclosed drawings.

A method for forming titanium silicide of semiconductor device according to the present invention is to utilize $TiCl_2$ gas as a reaction source capable of substituting for $TiCl_4$ gas in the formation of titanium silicide. At this time, hydrogen gas is used for the phase transformation from $TiCl_4$ to $TiCl_2$.

In the initial reaction for the formation of titanium silicide, the supplying source of Si atoms is not $SiH_4$ gas but the silicon substrate.

Below equations (1) and (2) respectively show the reactions in the formation of titanium silicide by the reaction of $TiCl_4$ or $TiCl_2$ and silicon substrate when different supply gas, $TiCl_4$ and $TiCl_2$, is used respectively.

$$TiCl_4 + 3Si \rightarrow TiSi_2 + SiCl_4 \quad (1)$$

$$TiCl_2 + (5/2)Si \rightarrow TiSi_2 + (1/2)SiCl_4 \quad (2)$$

Equations (1) and (2) are merely an example of one embodiment according to the present invention. One of ordinary skill in the art would recognize other variations, alternatives, and modifications.

From Equation (1), when $TiCl_4$ is used as source for the formation of titanium silicide, 3 atom of silicon is consumed to form one molecular of $TiSi_2$. Whereas in equation (2), when $TiCl_2$ is used as source, 5/2 atom of silicon is consumed. Thus, the use of $TiCl_2$ can decrease the consumption of silicon substrate compared with the use of $TiCl_4$. In case that hydrogen gas is supplied together with $TiCl_2$ gas, it is possible to selectively form $TiSi_2$ on the desired portions except on $SiO_2$ layer.

FIGS. 1A to 1D are simplified cross-sectional views of a semiconductor device showing a method for forming a titanium silicide in a semiconductor device and are merely an example of one embodiment according to the present invention. One of ordinary skill in the art would recognize other variations, alternatives, and modifications.

Figure 1A:
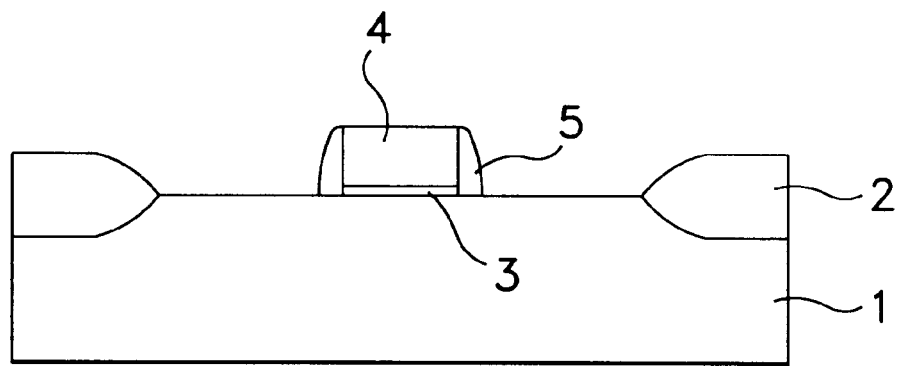
FIGS. 1A to 1D are simplied cross-sectional view diagrams illustrating a method according to the present invention.

Referring to FIG. 1A, N type or P type well is selectively formed on a semiconductor substrate 1 of silicon according to conventional processes. Afterwards, a field oxide 2 for the isolation of device, a gate oxide 3, a gate electrode 4 and a spacer 5 are formed on the semiconductor substrate 1 in that manner. Next, native oxide is removed by dipping the substrate 1 in HF solution. A wafer that is formed through the above mentioned steps, is known as a first state wafer.

The first state wafer is then moved to a reactor to clean off the remaining HF solution by $H_2$ or $SiH_4$ gas which is selectively supplied. Herein, the dipping and cleanning steps are performed by in-situ process.

Figure 1B:
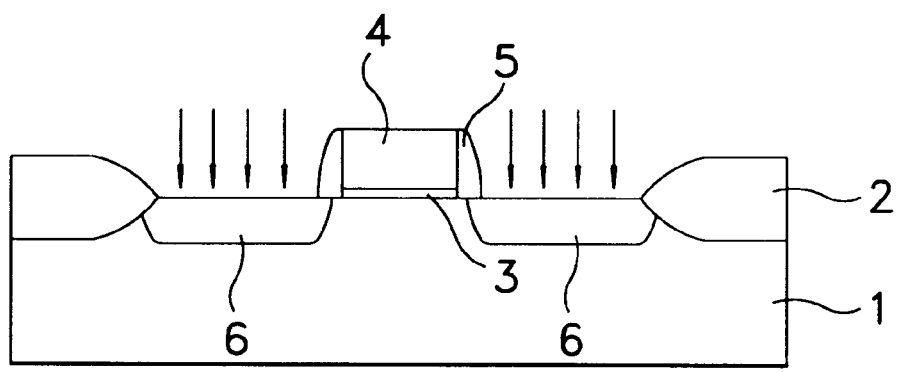

Referring to FIG. 1B, impurity ion of three valence or five valence is implanted into the first state wafer, and thermal annealing is performed to drive the implanted dopants. Herein, boron or $BF_2$ is selectively used for three valanece impurity and asenic is used for five valence impurity. There is provided a second state wafer in which source and drain are formed in the frist state wafer through the above-mentioned ion implantation and driving steps. The structure device as shown in FIG. 1B is referred to as the basic MOSFET structure.

Figure 1C:
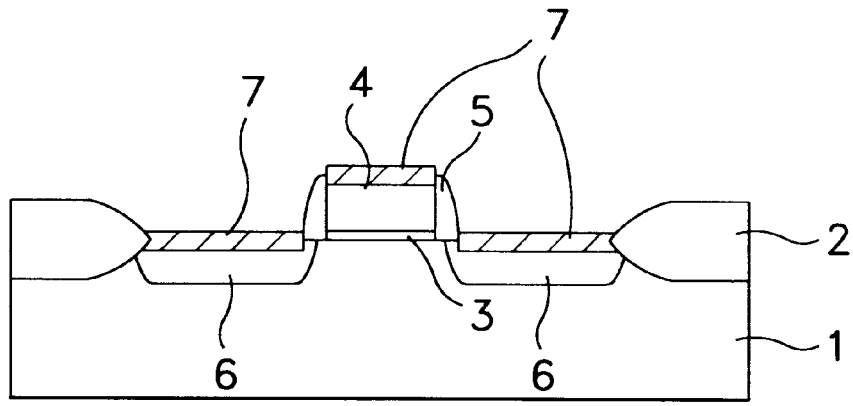

Referring to FIG. 1C, in the formation of titanium silicide, the second state wafer is inserted into a reactor for low pressure chemical vapor deposition, and $TiCl_2$, $SiH_3Cl_2$, $SiH_4$, and $H_2$ gases are supplied into the reactor. There is provided a third state wafer on which titanium silicide is formed by the reaction of the above gases.

Titanium silicide layer overlying the gate electrode 4 and the source and drain regions 6 includes a relatively planar interface with the gate electrode 4, the relatively planar interface being substantially free from gouges formed by a redistribution of a portion of the silicon atoms in the gate electrode 4.

Figure 1D:
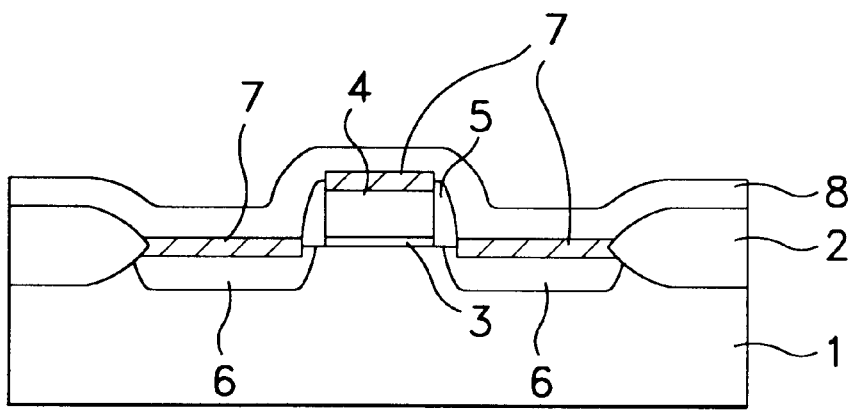

As shown in FIG. 1D, an insulating layer 8 is formed to insulate source, drain and gate electrodes on the third state wafer.

Figure 2:
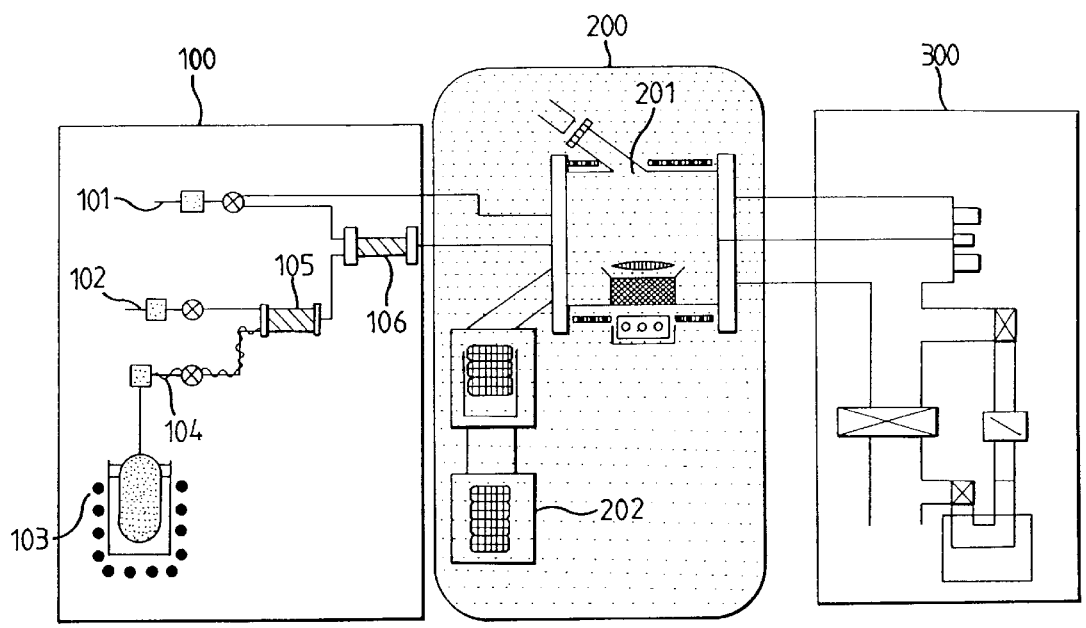
FIG. 2 is a simplified diagram of a CVD apparatus according to the present invention.

Referring to now FIG. 2, the method for forming titanium silicide on third state wafer will be described.

There is provided an apparatus for LPCVD that includes: a gas $H_2$; a reactor 200 where the above gases are supplied to; and a vacuum part 300 for bringing the reactor to a low pressure vacuum state.

Since the vacuum part includes a roughing pump and a turbo molecular pump, it is possible to lower the pressure of reactor 200 to $1 \times 10^{-7}$ Torr.

The gas supplying part 100 includes a $SiH_4$ supplying line 101 for supplying $SiH_4$ gas, a $H_2$ supplying line 102 for supplying $H_2$ gas, an evaporator 103 for transforming $TiCl_4$ from a liquid state to a gaseous state, a $TiCl_4$ supplying line 104 for supplying the transformed $TiCl_4$ of a gaseous state, a braking chamber 105 for reacting $H_2$ gas and $TiCl_4$ introduced from $TiCl_4$ supplying line 104 and $H_2$ supplying line 102, and a HCl removing chamber 106 for sufficiently removing HCl gas from the gases introduced in the braking chamber 105 and from $SiH_4$ supplying line 104.

$TiCl_4$ gas transformed in the evaporator 103 is supplied via the $TiCl_4$ supplying line 104 to the braking chamber 105 where it reacts with $H_2$ gas according to the below equation (3).

$$TiCl_4 + H_2 \rightarrow TiCl_2 + 2HCl \quad (3)$$

Reaction products of $TiCl_2$ and HCl are supplied to the HCl removing chamber 106, and $SiH_4$ gas from $SiH_4$ supplying line 101 is additionally introduced to the HCl removing camber 106 at room temperature. In order to react $TiCl_4$ and $SiH_4$, the HCl removing chamber 106 would have to be maintained at considerably high temperature. $SiH_4$ and HCl gases, however, have good reactivity at room temperature and react as shown below in equation (4).

$$SiH_4 + HCl \rightarrow SiH_3Cl_3 \quad (4)$$

After the reaction of equation (4) is sufficiently proceeded, gases of $SiH_xCl_y$, $H_2$, $SiH_4$ and $TiCl_2$ are supplied from the HCl removing chamber 106 to the reactor chamber 201. In the meantime, the temperature of substrate is stabilized by raising temperature of the reactor chamber 201 to the desired level using a resistance or an IR lamp heating method.

It is preferable to use a rod lock chamber in order to prevent oxidation and pollution of the wafer when the wafer for the formation of titanium siicide is inserted in or withdrawn from the reactor chamber 201.

Reaction for the formation of titanium silicide is continued until the desired thickness of silicide is formed. After the reaction is completed, introduction of reactant gases is shut off. Thickness of titanium silicide to be formed, can be controlled by lowering the temperature of the reactor chamber. Among titanium silicides with various phases, in order to form $TiSi_2$ of stable phase with the lowest sheet resistance, the following conditions are provided.

First, in order to remove native oxide existing on the surface of source, drain and gate electrodes, in-situ cleanning must be performed, in which the supplying gases are hydrogen gas or saline gas.

Second, in order to decrease pollution source, initial pressure of reactor chamber must be maintained below $1 \times 10^{-7}$ Torr.

Third, deposition pressure ranges from 0.01 mTorr to 10 Torr, flow rate of $TiCl_4$ $SiH_4$, $H_2$ are respectively 0.01 to 100 sccm, 0.1 to 1,000 sccm, and 1 to 10,000 sccm. In addition, temperature of substrate ranges from 400 to 800° C., and deposition thickness of titanium silicide ranges from 100 to 1,000 Å.

As described hereinbefore, although LPCVD method in the present invention is used to form titanium silicide, deposition temperature is lowered by 200° C. substituting $TiCl_2$ gas for $TiCl_4$ gas. In addition, the method according to the present invention decreases the number of processing steps because titanium silicide is formed only on the desired portions using not PECVD method but LPCVD. In other words, titanium silicide is not formed on field oxide and spacer. Moreover, the present invention provides effect of enhancement in yield and reliablity because consumption of substrate in initial deposition step decreases due to the use of $TiCl_2$ gas.

Although the foregoing invention has been described in some detail by way of illustration and example, for purpose of clarity of understanding, it will be obvious that certain changes and modifications may be practiced within the scope of the appended claims.

The above description is illustrative and not restirctive. Many variations, alternatives, and modifications, of the invention will become apparent to those of skill in the art upon review of this disclosure. Merely by way of example the invention may also be applied in the manufacture of DRAMs, ASICs, MICROs, and others. The scope of the invention should, therefore, be determined not with reference to the above description, but instead should be determined wit reference to the appended claims along with their full scope of equivalents.

What is claimed is:

1. A method of forming an integrated circuit device, said method comprising steps of:

providing a semiconductor substrate in a reactor;

providing a source of $TiCl_4$, and a source of hydrogen containing gas, said source of $TiCl_4$ and said source of hydrogen being coupled to said reactor;

forming $TiCl_2$ from an interaction with at least said $TiCl_4$ and said hydrogen containing gas in a chamber, said chamber being coupled between said reactor and said source of hydrogen and said source of $TiCl_4$;

introducing a gaseous mixture comprising said $TiCl_2$ and a silicon containing gas into said reactor; and forming a titanium silicide layer overlying said semiconductor substrate by an interaction of at least said $TiCl_2$ and said silicon containing gas.

2. The method according to claim 1, wherein said semiconductor substrate is on a state having a basic MOSFET structure that source, drain, gate electrodes, and spacer of said gate electrode are formed.

3. The method according to claim 2, wherein said semiconductor substrate is injected to the reactor after native oxide formed on the surface of source, drain, and gate electrodes, has been removed.

4. The method according to claim 3, wherein the removal of said native oxide comprises the steps of dipping the semiconductor substrate in HF solution and cleanning the semiconductor susbtrate to remove the remaining HF solution.

5. The method according to claim 4, wherein the cleanning step utilizes dry etching, in which the supplying gas is selected from $H_2$ or $SiH_4$ gases.

6. The method according to claim 4, wherein the dipping step and cleanning step are performed by in-situ process.

7. The method according to claim 1, wherein said semiconductor substrate is on a state having an insulating layer formed on a basic MOSFET structure that source, drain, gate electrodes, and spacer of said gate electrode are formed.

8. The method according to claim 1, wherein said silicon containing gas is $SiH_4$.

9. The method according to claim 1, wherein said silicon containing gas is $SiH_4$ and $SiH_3Cl_2$.

10. The method accordign to claim 1, wherein said titanium silicide is $TiSi_2$.

11. The method according to claim 10, wherein the thickness of $TiSi_2$ ranges from 100 to 1,000 Å.

12. The method according to claim 10, wherein the condition for the formation of $TiSi_2$ is as follows: flow rate of $TiCl_2$, $SiH_4$ and $H_2$ gases ranges from 0.01 to 100 sccm, from 0.1 to 1,000 sccm, and from 1 to 10,000 sccm respectively.

13. The method according to claim 1, wherein the substrate is maintained at a temperature of 400–800° C. in the step of forming titanium silicide.

14. A method of forming an integrated circuit device, said method comprising steps of:

providing a semiconductor substrate in a reactor;

introducing a gaseous mixture comprising $TiCl_2$ and a silicon containing gas into said reactor; and forming a titanium silicide layer overlying said semiconductor substrate by an interaction of at least said $TiCl_2$ and said silicon containing gas.

15. The method according to claim 14, wherein said semiconductor substrate is on a state having a basic MOSFET structure that source, drain, gate electrodes, and spacer of said gate electrode are formed.

16. The method according to claim 14, wherein said semiconductor substrate is injected to the reactor after native oxide formed on the surface of source, drain, and gate electrodes, has been removed.

17. The method according to claim 14, wherein said semiconductor substrate is on a state having an insulating layer formed on a basic MOSFET structure that source, drain, gate electrodes, and spacer of said gate electrode are formed.

18. The method according to claim 14, wherein said silicon containing gas is $SiH_4$.

19. The method according to claim 14, wherein said silicon containing gas is $SiH_4$ and $SiH_3Cl_2$.

20. The method accordign to claim 14, wherein said titanium silicide is $TiSi_2$.

21. The method according to claim 20, wherein the thickness of $TiSi_2$ ranges from 100 to 1,000 Å.

22. The method according to claim 20, wherein the condition for the formation of $TiSi_2$ is as follows: flow rate of $TiCl_{21}$ $SiH_4$ and $H_2$ gases ranges from 0.01 to 100 sccm, from 0.1 to 1,000 sccm, and from 1 to 10,000 sccm respectively.

23. The method according to claim 14, wherein the substrate is maintained at a temperature of 400–800° C. in the step of forming titanium silicide.

* * * * *

UNITED STATES PATENT AND TRADEMARK OFFICE
CERTIFICATE OF CORRECTION

PATENT NO : 5,924,009
DATED : July 13, 1999
INVENTOR(S): B. Park

It is certified that error appears in the above-identified patent and that said Letters Patent is hereby corrected as shown below:

At col. 2, line 3, please cancel "simplied" and substitute --simplified-- therefor;

at line 59, please cancel "cleanning" and substitute --cleaning-- therefor;

at line 64, please cancel "valanece" and substitute --valence-- therefor;

at line 65, please cancel "asenic" and substitute --arsenic-- therefor; and at line 67, please cancel "frist" and substitute --first-- therefor.

At col. 3, line 47, please cancel "camber" and substitute --chamber-- therefor; and at line 64, please cancel "siicide" and substitute --silicide-- therefor.

At col. 4, lines 8-9, please cancel "cleanning" and substitute --cleaning-- therefor;

at line 15, please insert a comma after "$TiCl_4$";

at line 37, please cancel "restirctive" and substitute --restrictive-- therefor; and at line 45, please cancel "wit" and substitute --with-- therefor.

UNITED STATES PATENT AND TRADEMARK OFFICE
CERTIFICATE OF CORRECTION

PATENT NO : 5,924,009
DATED : July 13, 1999
INVENTOR(S): B. Park

It is certified that error appears in the above-identified patent and that said Letters Patent is hereby corrected as shown below:

At col. 5, line 7 (claim 4, line 3), please cancel "cleanning" and substitute --cleaning-- therefor;

at lines 10-11 (claim 5, lines 1-2), please cancel "cleanning" and substitute --cleaning-- therefor;

at line 14 (claim 6, line 2), please cancel "cleanning" and substitute --cleaning-- therefor; and at line 24, please cancel "accordign" and substitute --according-- therefor.

At col. 6, line 31, please cancel "TiCl$_{21}$" and substitute --TiCl$_2$,-- therefor.

Signed and Sealed this

Second Day of May, 2000

Attest:

Q. TODD DICKINSON

Attesting Officer

Director of Patents and Trademarks